United States Patent [19]

Mulder et al.

[11] 4,371,795

[45] Feb. 1, 1983

[54] DYNAMIC MOS-LOGIC INTEGRATED CIRCUIT COMPRISING A SEPARATE ARRANGEMENT OF COMBINATORY AND SEQUENTIAL LOGIC ELEMENTS

[75] Inventors: Cornelis Mulder; Leendert Nederlof; Cornelis Niessen; René M. G. Wijnhoven, all of Eindhoven, Netherlands; Roelof H. W. Salters, Sunnyvale, Calif.

[73] Assignee: U.S. Philips Corporation, New York, N.Y.

[21] Appl. No.: 73,571

[22] Filed: Sep. 7, 1979

[30] Foreign Application Priority Data

Sep. 15, 1978 [NL] Netherlands .................. 7809397

[51] Int. Cl.³ .................. H03K 19/08; H03K 19/12
[52] U.S. Cl. .................. 307/440; 307/453; 307/459; 307/480; 307/481; 307/449
[58] Field of Search .............. 307/480, 481, 453, 459, 307/440, 448, 449, 463

[56] References Cited

U.S. PATENT DOCUMENTS

| | | | |
|---|---|---|---|
| 3,609,392 | 9/1971 | Tetik | 307/481 |
| 3,857,045 | 12/1974 | Low et al. | 307/481 |
| 3,870,897 | 3/1975 | Hatsukano et al. | 307/481 |
| 3,898,480 | 8/1975 | Spence et al. | 307/481 |
| 3,989,955 | 11/1976 | Suzuki | 307/481 |
| 4,040,015 | 8/1977 | Fukuda | 307/481 |
| 4,069,427 | 1/1978 | Masuda | 307/481 |
| 4,107,548 | 8/1978 | Sakaba et al. | 307/481 |
| 4,114,049 | 9/1978 | Suzuki | 307/481 |

Primary Examiner—Saxfield Chatmon, Jr.
Attorney, Agent, or Firm—James J. Cannon, Jr.

[57] ABSTRACT

An integrated circuit in dynamic MOS logic is composed of combinatory and sequential logic elements. Each of the latter comprises a succession of an input gate, an intermediate gate and an output gate which are activated to conduct by a corresponding phase of the first one and subsequent phases of a clock pulse cycle. The combinatory logic elements are all composed of gates of a single type, while the input signals are applied via the sequential logic elements and the output signals are output again via the latter elements. Thus, in the combinatory network only a sole type of interference is still relevant.

6 Claims, 10 Drawing Figures

|   | 34  | 35  | 36  | 37  |
|---|-----|-----|-----|-----|
| 1 | pr  | sa  | val | val |
| 2 | pr  | pr  | sa  | val |
| 3 | val | val | pr  | sa  |
| 4 | sa  | val | pr  | pr  |

DYNAMIC MOS-LOGIC INTEGRATED CIRCUIT COMPRISING A SEPARATE ARRANGEMENT OF COMBINATORY AND SEQUENTIAL LOGIC ELEMENTS

BACKGROUND OF THE INVENTION

The invention relates to an integrated circuit in dynamic MOS technology, having combinatory logic elements and sequentially operating logic elements (referred to hereinafter as sequential logic elements), and also having a clock input for receiving clock signals with at least three successive phases per clock pulse cycle. So-called three-phase and four-phase ratioless dynamic logic in MOS technology constitute attractive technologies for integrated circuits. The latter is described in the book "MOS-Integrated circuits", by "Engineering staff of American Microsystems, Inc.,", New York, 1972, notably pages 273–288. Apart from arguments concerning the speed of the circuit, the transistor dimensions are not very critical. This simplifies the electrical design of such circuits, which is very important in view of the increasingly large numbers of elements to be accommodated on a single chip. The fact that the dimensions of the transistors are not very critical is the reason why the operation of such a circuit is little influenced by parameter spread produced by the manufacturing process, so that a comparatively high yield percentage is realized during manufacture. Combinary logic elements are elements in which no separation in time exists between input signals and output signals. A change of an input signal at a given instant can cause a signal variation on the output or not, irrespective of the instant at which the former change occurs. Examples of combinatory logic elements are logic gates, inverters and signal amplifiers.

Said separation in time, however, does exist in sequential logic elements, so that a signal change on an input can be conducted only (possibly depending on the nature of the signal change) if this signal variation is received before a given instant. If the variation occurs at a later instant, the output signal in any case remains unmodified for the time being; it may change, one clock pulse period later, so that the time is quantized. A customary type of sequential logic element operates as a hold circuit and is referred to as a data flip-flop (DFF). In dynamic MOS technology, data is embodied as the charge on a wiring capacitance which is also referred to as a "node". A further advantage of this technology consists in the low power consumption, because it is merely necessary to charge and discharge the data-carrying node capacitances. On the other hand, the data value is valid for only a limited period of time in view of leakage of the charge. Generally, this is not objectionable. It is to be noted that in dynamic MOS logic the sequential nature of a logic element is imparted by the clock pulse control thereof. If a logic element is so driven by a number of successive phases of the clock pulse that a separation between input signals and output signals exists, it is sequentially operating; otherwise, it is combinatory in this context.

A problem is imposed by the fact that said technology is susceptible to crosstalk interference between crossing logic signal lines. For design systems involving a discrimination voltage near 0 volt, this is particularly risky for the logic level "0", because there is only a small margin between nominal voltage and discrimination voltage. The crosstalk can be mitigated by increasing the node capacitance of the disturbed signal line by assigning a larger area on the chip. In given cases a standard cell will have insufficient space available for this purpose. In that case the design must be modified, for example, by implementation of a similar function in a larger cell. It will then often be necessary to modify the complete design of the integrated circuit which is very expensive. It may even be that the same problem occurs again at a different location in the modified circuit, so that the redesign procedure must be repeated.

SUMMARY OF THE INVENTION

It is an object of the invention to provide an integrated circuit in the described technology in which, as a result of the mutual isolation of combinatory logic elements by interposed sequential logic elements, crosstalk between crossing signal lines is substantially mitigated in that logic functions are formed only under the control of given clock pulse phases.

The objects of the invention are realized in that the integrated circuit comprises a series of sequential logic elements each with a succession of an input gate, a data input which forms an input of the sequential logic element, at least one output gate, a data output which forms an output of the sequential logic elements, and an intermediate gate which is connected between the input gate and said at least one output gate, the succession of input gate, intermediate gate and output gate being activatable to conduct in this succession by the corresponding signals of a first one and subsequent phases of said phases of a clock pulse cycle, with the result that all input gates and all intermediate gates of the series of sequential logic elements are of a mutually corresponding type, all output gates being mutually of at least a corresponding type, while input gates, intermediate gates and output gates are of a different type with respect to each other, there being provided a set of combinatory logic elements which form part of said input gates in order to apply the combinatory logic signals formed in the circuit to the series of sequential logic elements, the data inputs of the set of combinatory logic elements originating from outputs of the series of sequential logic elements. Therefore, in such a sequential logic element at least three successive clock pulse phases are required in order to obtain said separation. For the formation of combinatory logic functions, however, phases are required, so that in principle no optimum processing speed per clock pulse cycle is obtained; however, this is more than compensated for by the reduced susceptibility to interference which enables a higher clock pulse frequency to be used. In the case of three phases per clock pulse cycle, there exist three types of gates; in the four phases, there exist four types of gates. In the latter case, for example, the input gate may be of the type I, the intermediate gate of the type II, and the output gates of the type III or IV, or even a mixture of gates of types III and gates of type IV. Thus, not all four gate types are used. The combinatory logic elements are activated together with the input gate. As a result of the systematic separation of combinatory elements and sequential logic elements, only given combinations of crossing lines occur, i.e. in the above example only the lines belonging to a type I gate (within the sequential logic elements there are also other crossings, but the sequential logic elements are designed as a standard cell, so that internal disturbances can be prevented by suitable proportioning). The remaining crossings appear to be of such a type that the logic "1" may be somewhat nearer to the discrimination level (there is sufficient room in the difference between the nominal voltage and the discrimination level), while on the other hand the logic "0" is situated further from the discrimination level, as will be described hereinafter. The length of a clock pulse cycle as a whole may be chosen to be shorter, so that a high processing speed is realized.

Preferably, the circuit is adapted to be controlled by a clock pulse with four phases per clock pulse cycle. Four-phase logic is often used. In prior art, twice per clock pulse cycle a number of combinatory logic functions is formed. Here, however, this occurs only once per clock pulse cycle, but this drawback is more than compensated for by the possible increase of the clock pulse frequency.

Preferably, the sequential logic elements of said series are arranged in a single, uninterrupted row, the connections thereof to said set being situated at the same side of the row. Thus, the sequential logic elements can constitute a single library cell or a few cells. Libraries of this kind are customarily used for computer aided design of large integrated circuits; the use of such rows facilitates the design.

FURTHER ASPECTS OF THE INVENTION

Preferably, each sequential logic element of the series is connected as a single hold circuit (DFF), said elements being interconnected in that a data output of a preceding sequential logic circuit of the row is connected to a data input of a next sequential logic circuit of the row by way of an additional input branch of the input gate, said additional input branch having a control input for being made conductive by means of a control signal thereon which is common to the sequential logic elements of the row, while excluding further data inputs of the sequential logic circuit, said row comprising at one end, by way of said additional input branch at said end, an input for receiving a test pattern. The testing of elaborate logic circuits is difficult because the generation of a well-defined starting condition for the sequential logic elements and also for an extensive network of combinatory logic elements is problematic: preferably, the test is to be performed with a small number of selected test patterns. However, said additional facility enables the sequential logic elements to be serially loaded or emptied without a requirement for additional data connections between these elements and the outer world. The actual test takes place in that said series connection is interrupted. As regards elaborate networks of combinatory logic elements, a sub-division into smaller networks takes place as if it were, said smaller networks being interconnected by means of hold elements.

Preferably, said series include an output for supplying a serial test result of the other end. This facilitates the evaluation of the test result.

Preferably, at least one of the sequential logic elements has two output gates, one data output thereof being connected to respective data inputs of the group of combinatory logic elements, the intermediate gate of the relevant sequential logic element being connected, by way of an inverting output and a non-inverting output, respectively, to the output gates in order to apply two data, one being the inverse of the other, together to the group of combinatory logic elements. On the one hand, it has been found that this makes the sequential logic elements only slightly more complex. On the other hand, since it is often necessary to use given data in inverted as well as non-inverted form, additional inversion is no longer required and the circuit as a whole is simpler. Generally, all sequential logic elements may also be constructed to supply only one signal. This signal may correspond to the non-inverted value of the input signal as well as to the inverted value thereof.

Preferably, the data node of the input gate is connected to be precharged by the first clock pulse phase and sampled by the second clock pulse phase, the data outputs of the sequential logic elements being connected to the control electrode of a respective non-linear MOS capacitor, the other electrode of which is connected to a control terminal in order to be activated during the first and the second phase of the clock pulse cycle and to conduct this activating signal by way of the high value of the capacitance or to block this signal by way of the low value of the capacitance, respectively. It has been found that the logic level which differs from zero is thus better suitable for activating the subsequent sequential logic element, hardly any problems being experienced from the interference caused by changing signal levels in the combinatory logic elements.

The advantages according to the invention can be summarized as follows. The "zero" level in the combinatory logic is immune to crosstalk from other lines. The "one" level can also be rendered sufficiently immune to such crosstalk by correct proportioning of the circuit. As a result, it is no longer necessary to take into account this crosstalk during the design of the combinatory logic (which differs from one circuit design to another). Inside the sequential logic element this crosstalk remains a problem, but the solution has to be designed only once into this standard module. Furthermore, the input and the output of the sequential logic element are separated by an adequate phase difference in the clock drive. As a result, the clock pulse frequency may be higher, for example, as high as 10 MHz. The input is fast, or, alternatively, logic of a complex nature can be used, because in the gate of the type 1 at the input only a node having a comparatively small and fixed capacitance is to be discharged. The sequential logic element may be a stand module which is suitable for computer aided design (CAD). Finally, the testing of a complex circuit is also simplified.

The invention will be described in detail hereinafter with reference to the accompanying diagrammatic drawings.

DETAILED DESCRIPTION OF THE INVENTION

Figure 1:
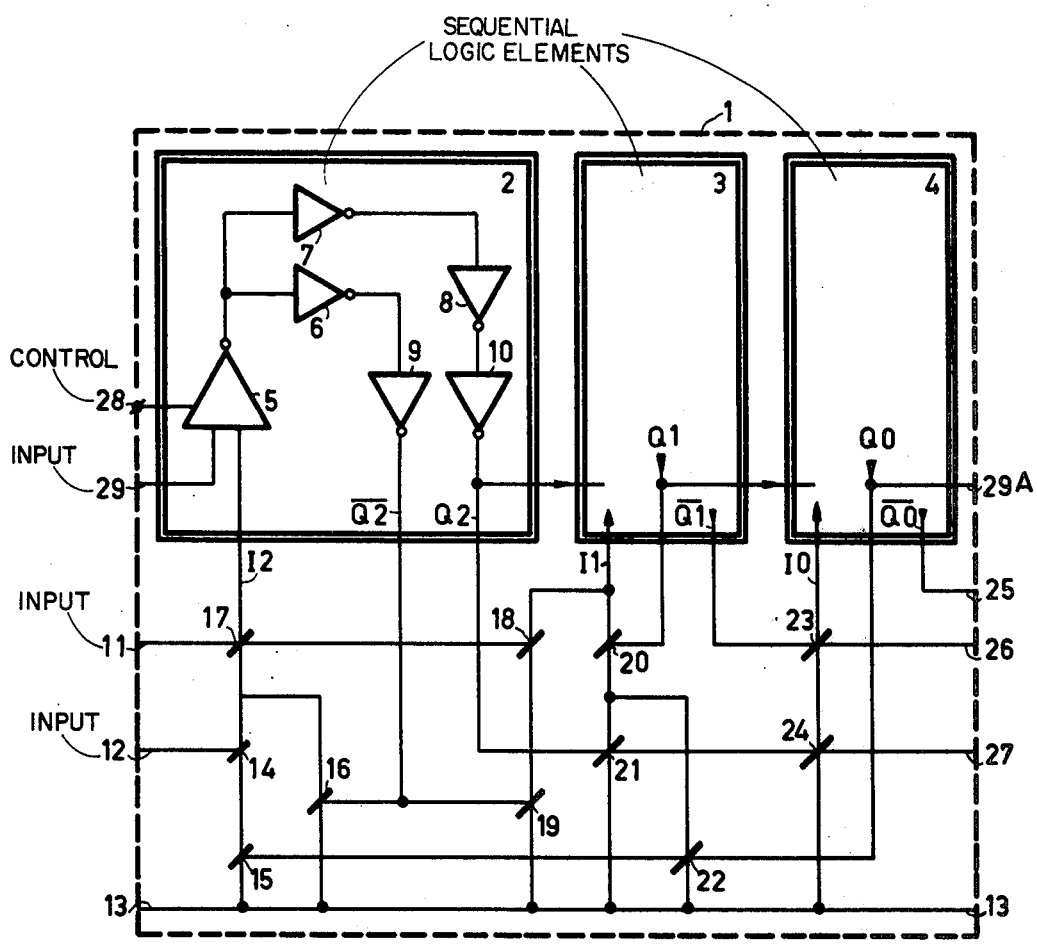
FIG. 1 shows a block diagram of an integrated circuit according to the present invention.
Figure 2:
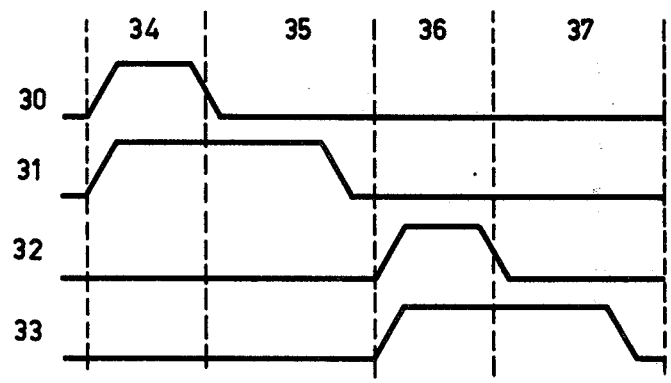
FIG. 2 shows a clock pulse diagram.

FIG. 1 shows a part of a block diagram of an integrated circuit in accordance with the invention which is enclosed by the interrupted line 1. The circuit is composed of transistors of the n-MOS-enhancement type which become conductive when a sufficiently positive control signal is applied to the control electrode thereof. In the present example, clock pulses having +12 volts and 0 volts as the binary levels will be used, but +5 volts is also an adequate positive voltage level, even though the speed is then lower. The elements 2, 3 and 4 are sequential logic elements; the elements 14–24 together form combinatory logic functions. The elements 5–10 form inverters, the clock pulse lines connected thereto not being shown in detail. The example is suitable for a four-phase clock pulse system which is shown in FIG. 2. The input lines 11, 12 are connected to outputs of other sequential logic elements which correspond to elements 2–4 and which are not shown for the sake of simplicity. The line 29 can carry an input signal for the circuit, the line 28 a control signal, and the line 29A an output signal. The latter signals can communicate, either with further parts of the integrated circuit or with the environment via bonding pads. The nature of the control signal will be described at a later stage. The line 13 carries the clock signal 30 of FIG. 2. The line 11 carries the logic signal A2, while the line 12 carries the logic signal B2. The elements 14–24 are formed by transistors, the horizontally shown connection being each time connected to the control electrode, while the vertical lines form the current connections. The transistors themselves are denoted by an oblique line. The element 2 receives the signal I2 and ensures that the same data is available on its output one clock pulse period later, i.e. in non-inverted form (Q2) as well as in inverted form ($\overline{Q2}$), the stroke denoting an inverted value. Thus:

$$I2 = A2 \cdot (\overline{Q}2 + B \cdot Q0)$$

Therein, a dot indicates a logic AND-function and a plus sign a logic OR-function. Thus:

$$I1 = A2 \cdot \overline{Q}2 + Q1(Q2 + Q0)$$

$$I0 = Q2\overline{Q}$$

The signals $\overline{Q0}$, $\overline{Q1}$ and Q2 appear on the output lines 25, 26, 27, respectively. In principle, the circuit may have eight statuses as embodied in the three signals I2, I1, I0, the signals on the inputs 11, 12 determining the stepping through these statuses. The output signals Q0, $\overline{Q0}$, $\overline{Q1}$, Q2 on the line 29A, 25, 26, 27 respectively, can be applied to either further combinatory and/or sequential logic elements (not shown) or to the environment via one or more bonding pads of the integrated circuit. The sequential logic elements shown are connected to the combinatory logic elements on the lower side. In a large and complex circuit, a second series of sequential logic elements can be used which comprise all connections on the upper side; a band of combinatory logic elements is then bounded on two sides by a series of sequential logic elements. The latter elements may then be arranged back-to-back in a double series. In some cases it may also be useful for a sequential logic element to have an input, on the one side and an output on the opposite side.

The signals on the inputs 11, 12 can be derived from further sequential logic elements which are not shown.

The combinatory logic functions in the elements 14–24 in FIG. 1 are given merely by way of example; a variety of other functions are possible. In any other circuit, serving a different purpose, these configurations of combinatory logic circuits are usually completely different. The term "wild logic" is commonly used. In the block 2 (having a construction corresponding to that of the block 3, 4) the elements 5–10 form inverters which operate as gates. The inverter 5 is of the type 1, the inverter 7 is of the type 2, the inverters 6, 8 are of the type 3, and the inverters 9, 10 are of the type 4. These relevant types will be described in detail hereinafter. These inverters are shown per se in FIGS. 5–27 (page 286) of the aforementioned book (be it with control signals of the other polarity).

In this respect, FIG. 2 shows a four-phase clock pulse cycle for use in the arrangement shown in FIG. 1. Curves 30–33 indicate four clock-pulse signals which are supplied on separate lines. During the first phase (34), the curves 30 and 31 become "high". This signal has a value of, for example, +12 volts. The other signal has a value of approximately 0 volt. When n-MOS-transistors are used, the discrimination or threshold level is then situated at approximately + (1–2) volts. During the second clock pulse phase (35), the curve 30 becomes low again directly at the beginning, while the curve 31 becomes low again only at the end of this phase. At the beginning of the next phase (36), the curves 32 and 33 become high; this takes place only briefly after the curve 31 has become low. At the beginning of the last phase (37), the curve 32 becomes low again, while the curve 33 becomes low again only at the end of this phase. The cycle then recommences. Also after the curve 33 has become low, there is a short interval before the curves 30 and 31 can become high again and the cycle is repeated. With respect to the clock pulse cycle, the phase 34 as well as the phase 36 may be considered to be the "first" one. The curves 30–33 are indicated as the clock pulse signals $\phi1$–$\phi4$, respectively.

Under the control of the clock pulse $\phi1$, the input node (i.e. the wiring capacitance thereof) is precharged to a high potential during the first phase. This is applicable to all sequential elements 2, 3, 4. Depending on the control signals on the MOS-transistors 14–24, these transistors are conductive or not. The line 13 also receives the signal of the clock pulse $\phi1$, so that during the first phase (34) there is no conductive connection between a high and a low potential; this diminishes dissipation. During the second clock pulse phase, the line 13 is low and the corresponding node (nodes) is (are) samples by a series connection of a transistor, controlled by the clock pulse signal $\phi2$, and the combinatory logic elements 14–24. When the latter form a conductive connection to the line 13, the relevant node is discharged to this line to logic "0"; otherwise, this node remains at a high potential. Such a node then contains a "valid" data in the third and the fourth phase (36, 37). Under the control of the successive phases of this clock pulse cycle, the data formed in the sequential logic elements, 2, 3, 4 is applied to the outputs thereof. During the next first phases of a clock pulse cycle, the formation of the combinatory logic functions is repeated. The generation of the four phases of a clock pulse cycle is realized in a conventional manner and will not be described for the sake of brevity. The actual clock pulse connections are shown in later Figures.

Figures 3, 4:
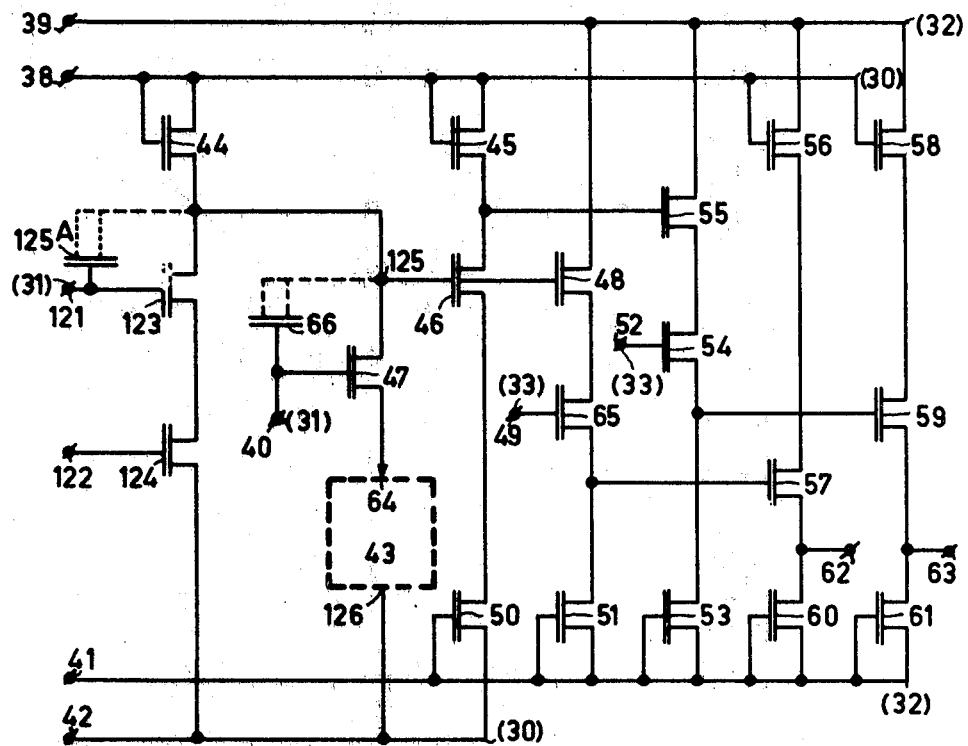
FIG. 3 shows a sequential logic element.
FIG. 4 shows a function table.

In this respect, FIG. 3 shows a more detailed diagram of a sequential logic element (20) like the components 2, 3, 4 in FIG. 1.

The circuit comprises inputs 38, 39, 40, 41, 42, 49, 52, 121, for clock pulse signals, inputs 64, 122, for data signals, outputs for data signals 62, 63, n-MOS-transistors 44–48, 50, 51, 53–61, 65, 123, 124 and capacitor elements 66, 125A. Also shown is a block 43 in broken lines to symbolize a combinatory logic circuit as described in detail with reference to FIG. 1. This circuit presents a data signal on the input 64 of the sequential logic circuit and on any further inputs of such sequential logic circuits (not shown). The outputs 62, 63 may be connected (in a manner not shown) to data inputs of sequential and combinatory logic circuits. The circuit in the block 43 can receive the latter or other data signals on data inputs (not shown). Furthermore, the reference numbers within parentheses indicate which wave forms of FIG. 2 are received by the various clock pulse inputs. The series connection of transistors 44, 47 represents the inverting input gate 5 of FIG. 1. The series connection of transistors 45, 46, 50 represents inverting gate 7 of FIG. 1. The series connection of transistors 55, 54, 53 represents the inverting gate 8 of FIG. 1. The series connection of transistors 56, 57, 60 represents the inverting gate 9 of FIG. 1. The series connection of transistors 58, 59, 61 represents the inverting gate 10 of FIG. 1. The arrangement shown in FIG. 1 thus comprises an input gate 5, two parallel connected output gates 9, 10, and two networks comprising the gate 6 and the gates 7, 8, respectively, said networks together performing the function of an intermediate gate. In given cases, only one of the series 6+9, 7+8+10 may suffice.

In this respect, FIG. 4 shows a diagram concerning the functional statuses of the dynamic gates of the type 1 (element 5 in FIG. 1), the type 2 (element 7 in FIG. 1), the type 3 (elements 6 and 8 in FIG. 1), and the type 4 (elements 9 and 10 in FIG. 1), respectively, the type numbers of which are shown in the left column. It is to be noted that the notation of the type numbers in the cited literature is different. The upper line of FIG. 4 indicates the respective phases of a clock pulse cycle in accordance with the notation of FIG. 2. For the time being it is assumed that the terminal 121 is continuously at a low potential, so that the transistor 123 is continuously blocked. During the phase 34, the transistors 44 and 47 are conductive. The node 125 (that is to say the wiring capacitance of this point in the circuit) is then in the precharging phase up to the potential of the line 38 minus one threshold voltage. Depending on the signals received, the circuit 43 then forms a conductive connection between the lines 64 and 126. The line 42 is then also high, because otherwise a conductive connection is liable to arise between the line 38 and the line 42; this could possibly involve undesirable dissipation. This situation is indicated in FIG. 4 by "pr". During the phase 35, the line 38 assumes a low potential again, so that the transistor 44 is blocked. The transistor 47, however, remains conductive and the line 42 also assumes a low potential again. Depending on the logic function in the block 43 and the input signals received therein, a conductive condition does or does not arise between the lines 64 and 126. For the node 125, and hence for the gate 1 as a whole, the sample situation then occurs. If in the block 43 a conductive connection is established, the node 125 is discharged to a low potential; however, if the connection between the lines 64 and 126 is blocked, the node 125 remains at a high potential. At the end of the phase 35, the transistor 47 is blocked in that the potential on the terminal 40 becomes low again. During the next two phases of the clock pulse cycle, the node 125 floats and the data is formed by the charge on the wiring capacitance of this node. The data is then valid, which is indicated by the letter-combination "val" in FIG. 4.

During the phase 34 the transistor 45 is also conductive. The transistor 50, however, is then blocked because the control electrode is actuated by the signal of curve 32. The junction of the transistors 45 and 46 is then charged to a high potential in any case. During the phase 35, this situation is maintained, because both transistors 45 and 50 are then blocked. The phases 34 and 35, therefore, are indicated together as a "precharge" situation for the gate of the type 2 in FIG. 4.

The element 66 is a capacitance which is formed in the same manner as the transistors of the circuit. If the control electrode (terminal 40) thereof carries a signal which exceeds that of the other electrode by at least one threshold voltage, a channel is formed and the capacitance assumes a high value. This element corresponds to element 85 in FIG. 5 and will be elaborated with respect to this Figure.

During the phase 36, the transistor 45 is blocked and the transistor 50 is conductive. If the junction of the transistors 44 and 47 is at a low potential ("0"), the transistor 46 remains blocked and the junction of the transistors 45 and 46 remains at a high potential ("1"). If the junction of the transistors 44 and 47 carries the data "1", the transistor 46 becomes conductive and the junction of the transistors 45 and 46 becomes logic "0". Thus, this is the "sample" phase, denoted in FIG. 4 by sa. During the phase 37, the transistor 50 is blocked, regardless of the condition of the transistor 46, and the valid phase is realized. The transistors 45, 46 and 50, therefore, form an inverting gate in the same way as the series connection of the transistors 44 and 47 with respect to the output signal of the block 43.

During the phase 36, the transistors 51, 53, 54 and 65 are conductive and the junctions of the transistor pairs 51/65 and 53/54 are charged to a high potential (precharging phase). During the phase 37, the transistors 51, 53 are blocked and the transistors 54, 65 are conductive. The voltage conditions on the junctions of the transistor pairs 44/47 and 45/46 then determine whether the transistors 48 and 55, respectively, become conductive. If they become conductive, the relevant nodes become low again during this sample phase; otherwise, they remain at a high potential. During the subsequent phases 34, 35 (of the next clock pulse cycle), the transistors 51, 53, 54, 65 are blocked and the output data is valid. The gates of the type 3 thus also operate as inverters.

The gates of the type 4 (transistors 56/57/60 and 58/59/61) are constructed like the previously described gate of the type 2, but are controlled by the other phase of the clock pulse cycle, while the output terminals 62, 63 are connected to the date-carrying nodes of these gates. Thus, a very good isolation is obtained between the input and the output of the sequential logic circuit. The line 64 thus carries the input signal I, the terminal 62 carries the inverted output signal $\overline{Q}$, and the terminal 63 carries the non-inverted output signal Q. The latter two signals become available during the same clock pulse phase (35).

The input gate (precharged by way of the transistor 44 during the phase 34) comprises an additional branch which includes a transistor 123 and a capacitance 125A. These elements functionally correspond to the elements 47 and 66, respectively, but have a smaller dimension in the integrated circuit, because they are not connected to a combinatory network which may possibly have large dimensions. Furthermore, this branch comprises a transistor 124 which receives a clock signal in accordance with the curve 30 in FIG. 2 on the line 42. The terminal 122 receives a data input signal and corresponds to the line 29 of FIG. 1. This terminal 122 is used for receiving the output data Q of the preceding sequential logic element in the series in the same manner as indicated in FIG. 1 for the signals Q2 (from 2 to 3), Q1 (from 3 to 4) and Q0 (on line 29A). The terminals 121 and 40 in FIG. 3 can thus be alternatively actuated. When the terminal 40 is actuated, the sequential logic element receives the data signal formed in the block 43 (i.e. in the combinatory logic circuit) and the intended logic function is performed. However, if the terminal 121 is actuated, the sequential logic elements are connected in series in order to receive either a test pattern as a shift register (on the line 29 in FIG. 1) or the result of the processing of a test pattern to be supplied on the line 29A. The evaluation of the test result does not form part of the present invention, so it will not be elaborated herein. The dual control of the input gate 5 in FIG. 1 is symbolized by a line 28 in FIG. 1; this control is not shown for the modules 3, 4 for the sake of simplicity.

Figure 5:
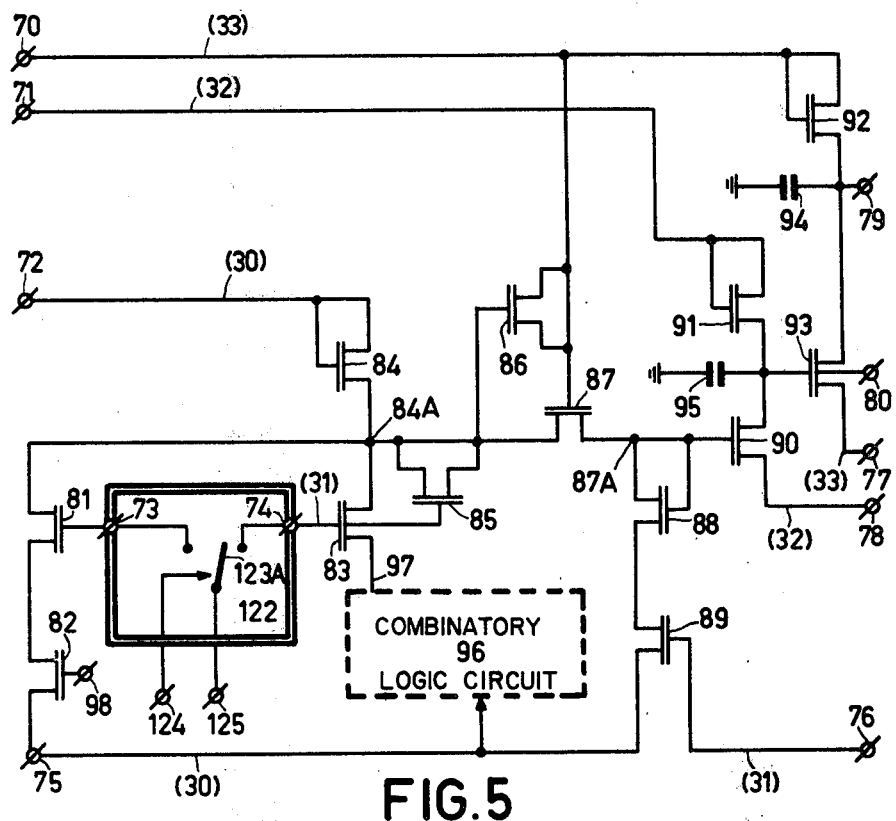
FIG. 5 shows a second sequential logic element.
Figure 6:
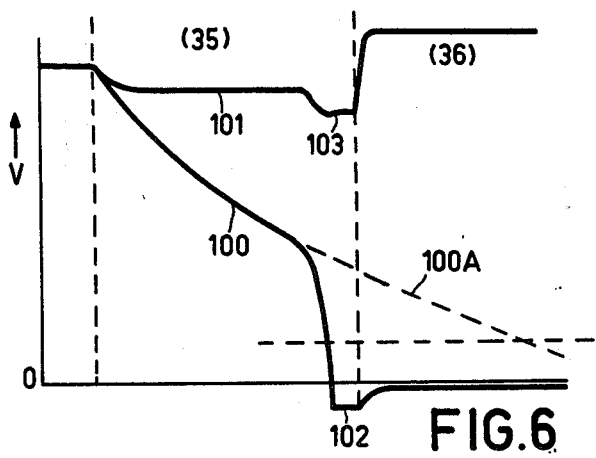
FIG. 6 shows some voltage curves.

FIG. 5 shows a detailed diagram of a second sequential logic element which also operates under the control of a four-phase clock pulse cycle in accordance with FIG. 2. The circuit comprises inputs 97, 98 for data signals, inputs 70 to 78 for clock signals, outputs 79, 80 for data signals, transistors 83–93, and two parasitic capacitances 94, 95 which are formed by the wiring. Furthermore, there is provided a combinatory circuit which is represented by the block 96 denoted by broken lines. For the co-operation between combinatory and sequential logic elements, the same is applicable as stated with respect to FIG. 3. FIG. 6 shows some signal curves in this respect.

In operating conditions, the terminal 73 is continuously at a low potential and the transistor 81 (corresponding to the transistor 123 in FIG. 3) is continuously blocked. During the phase 34 of the clock pulse cycle, the transistors 83 and 84 are conductive and the node 84A is precharged, a conductive connection to the terminal 75 then being formed in the block 96 or not. The latter terminal receives the signal 30 in order to prevent dissipation. The elements 85 (cf. element 66 in FIG. 3) and 86 form non-linear capacitances. If the control electrode carries a signal which exceeds that on the other electrodes by a threshold voltage, the capacitance is high; otherwise, it is negligibly small. During the phase 35, the transistor 84 is blocked and the sample phase takes place for the gate of the type 1 (node 84A) via the network 96. During the phases 36 and 37, the data of the node 84 is valid. The transistors 88 and 89 are not indispensable per se and will be ignored for the time being. During the phase 36, the transistor 87 is conductive, so that an intermediate gate is implemented. The transistors 91 and 92 are also conductive during the phase 36 until the node of the terminal 80 is precharged to a high potential. During the phase 37, the transistor 87 remains conductive. If the conducted potential is high, the transistor 90 remains conductive and the junction of the transistors 90 and 91 (sample phase) becomes low again. If the potential conducted by the transistor 87 is 0, the transistor 90 is blocked and the junction of the transistors 90 and 91 maintains the logic value "1". The transistors 90 and 91 thus form an inverting output gate: the output data is available on the terminal 80.

During the phases 36 and 37, the transistor 92 is conductive and the node of the terminal 79 assumes a high potential. During the subsequent phase 34, the transistor 92 is blocked and the terminal 77 assumes the potential 0. The logic value on the terminal 79 then becomes the inverted value of the logic value on the terminal 80.

FIG. 6 shows the voltage variation at the junction of the transistors 83 and 84 (node 84A) for different cases. The curve 100 represents the case where the data "0" is to be generated at this junction; the curve 101 concerns the data "1". The time is plotted horizontally in the Figure and the voltage is plotted vertically. The lower non-interrupted straight line corresponds to a voltage of 0 volt (logic "0"); the logic level "1" corresponds to a voltage of approximately 10 volts (12 volts minus a threshold voltage). The horizontal interrupted line indicates the discrimination level which is chosen to be $+1\frac{1}{2}$ volts in this case. To the left of the first vertical and interrupted line, the precharging phase is shown and the potential of the relevant point has become approximately $+10$ volts, i.e. approximately one threshold voltage lower than the potential of the clock pulses which is approximately $+12$ volts. If the data "0" is to be stored and the elements 85 and 86 are absent, the curves 100, 100A are followed; these curves together are more or less exponential. The phase 36 cannot be started before the curve 100A has passed the discrimination level ($+1\frac{1}{2}$ volts). However, if the terminal 74 assumes a low potential, i.e. just before the end of the phase 35 (cf. FIG. 2), the capacitance of the element 85 is still comparatively high at this instant, so that the control signal is suitably applied to the node 84A (part 102 of the curve). A voltage level which is negative by approximately one threshold value (approximately 1 volt) can be readily reached. At the beginning of the phase 36, the capacitance of the element 86 is comparatively low and the signal of the line 70 (signal 33a) causes only a small voltage increase. The voltage can become approximately zero, or also positive by some tenths of a volt. If the data on the node 84A is to be logic "1", no conductive connection is thus present in the block 96. At the beginning of the phase 35, a limited voltage decrease occurs due to capacitive cross-talk under the influence of the signal 30. The element 85 then has a so-called channel having a comparatively high resistance, so the capacitance has only a comparatively small effect in any case. The voltage decrease caused by the negative edge in the signal 31 at the end of the phase 35, therefore, is small. The element 86, however, has a high capacitance. At the beginning of the phase 36, the signal 33 on the line 70 causes a comparatively high voltage rise on the node 84A due to capacitive crosstalk, as indicated at 103. The margin between the two signal levels is thus increased by the elements 85 and 86.

The transistors 88 and 89 serve to discharge the node 87A during the phase 35 by way of the conductive transistor 89: if the node 87A has a potential which is higher than approximately one threshold voltage, the transistor 88 also becomes conductive and this node is "pre-discharged" during the phase 35. During the phase 36, the transistors 89 is blocked again. Any objectionable residual charges on the node 87 are thus mitigated. An even better realization is found when the control electrode of the transistor 88 is not connected to the node 87A, but rather to the terminal 79. In the present case, this solution is not chosen in view of the additional substrate surface area required. The tolerance in the clock pulse amplitude is increased from approximately 0.3 volts to more than 0.5 volts by the elements 88, 89. The Figure furthermore shows the capacitances 94, 95 which symbolize the line capacitances of the outgoing signal connections and which as such constitute a load for the output gates. The circuit of FIG. 5 thus also comprises an input gate (elements 83, 84), an intermediate gate (element 87), and output gates which supply mutually inverse data (elements 91/90 and 92/93).

The circuit shown in FIG. 5 also comprises a control element 122 which includes an input 125 for the clock pulses according to the curve 31 in FIG. 2. Depending on the position of the selector switch 123A, these clock pulses are applied either to the terminal 73 or to the terminal 74. The terminal 74 controls the transistor 83 to take up the combinatory logic functions formed in the block 96 (see also FIGS. 1, 3). The terminal 73 controls the transistor 81 to conduct the signal from the terminal 98 and the transistor 82. The terminal 98 again receives the output signal of a previous sequential logic element of the relevant series (unless the relevant element is the first one of this series; in that case, this terminal may be connected to a bonding pad for the supply of data from the environment). The selector switch 123A can be controlled in known manner by an external signal on the terminal 124. The sequential logic elements may again be connected as a shift register in order to receive a binary test pattern. The element 122 may be used for a large number of sequential logic elements in common.

Figure 7:
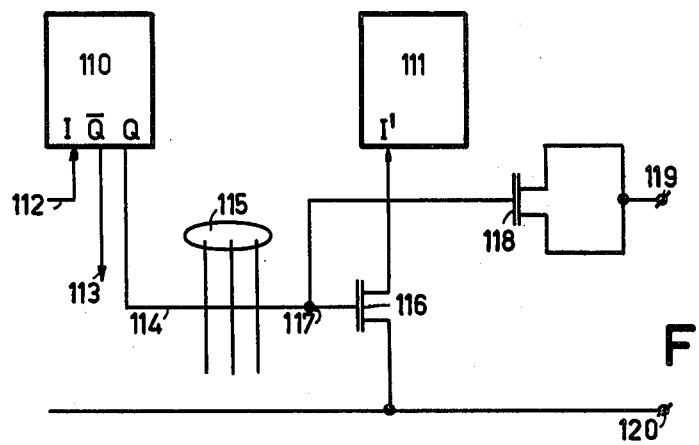
FIG. 7 shows a supplement to the circuit shown in FIG. 1.

FIG. 7 shows a supplement to the circuit shown in the FIGS. 1, 3, 5. Only two sequential logic elements are indicated: 110, 111; while only the transistor 116 of the combinatory logic elements is shown. The module 110 receives the signal I from a signal source (not shown) via the line 112 and produces the output signals Q, $\overline{Q}$ on the lines 114 and 113, respectively. The line 120 receives the clock pulse $\phi 1$. In this embodiment, the line 114 crosses the signal lines 115 which may carry arbitrary logic signals per se, so that via the wiring capacitances between the lines 114 and 115 a crosstalk signal can occur on the line 114. As has already been stated, during the fourth clock pulse phase (37 in FIG. 2), the line 114, and hence also the node 117, is precharged to a high voltage and sampled during the subsequent phase (34 in FIG. 2) by way of transistors which are not shown for the sake of brevity. During the subsequent clock pulse phase (35 in FIG. 2), the data of the node 117 is valid.

In the chosen logic construction, the combinatory logic elements form part of a "distributed" gate of the type 1 (element 5 in FIG. 1), so that many combinations of crossing (and hence disturbing) lines are eliminated. The following possibly hazardous crossings remain:

a1: crossings of the line 114 with lines carrying the output signals (Q, $\overline{Q}$) of other sequential logic elements of the series.

a2: ditto for the sequential logic elements of other series operated by the same clock pulse pattern.

b: input lines (OD tracks, see FIG. 10) which are completely or partly precharged to a high potential during the clock pulse phase 34, depending on the logic condition of the combinatory logic elements (transistors 14–24 in FIG. 1).

These situations are considered as follows:

1. If the signal Q (or $\overline{Q}$) on an output has the value "1", it can be disturbed in that at the end of the phase 37 many other outputs (gates of the type 4 in FIGS. 1, 3) again obtain a low potential (change from 1 to 0). The logic level is then decreased; therefore, this concerns crosstalk of the type a1, a2.

2. In the above case, crosstalk of the type b is not relevant, because these lines again assume a low potential, by the logic situation still prevailing, after the precharging in the phase 34, via sample discharging in the phase 35, so that the original crosstalk is compensated for with opposite sign.

3. On the other hand, if the signal Q (or $\overline{Q}$) has the value "0" (so a low potential at the end of the phase 34), the crosstalk of the type a1, a2 is not relevant: during the phase 34, the gates of the type 4 are grounded via conductive transistors.

4. In that case, the crosstalk of the type b has the following effect. At the beginning of the phase 34, a positive crosstalk signal is generated on the disturbed node; however, this signal is short-circuited in that the relevant node is grounded via a conductive transistor. At the end of the phase 34, the same crosstalk is again received with opposite sign (and is not short-circuited), so that the voltage on the disturbed node is decreased. Due to the latter effect, the margin between "1" and "0" is even increased to good advantage.

It has been found that a hazard occurs only in the case described sub "1". Therefore, the NON-linear MOS-capacitor having an increased surface 118 is added. This capacitor is precharged during the phase 36 (FIG. 4). The terminal 119 receives the clock pulse $\phi 2$ (signal 31 in FIG. 2). If the potential on the node 117 is low during the clock pulse phase 37, the capacitance of the element 118 is low, so that it can be neglected. However, if the potential of the node 117 is high, this node receives a signal, conducted via the capacitance 118 on the leading clock pulse edge (phase 34): the signal margin between logic "0" and logic "1" on the node 117 is thus easily maintained. If the charge (proportional to the surface area) in the capacitance 118 is larger than the charge in the various wiring capacitances, the effect of the disturbance is removed. The above is applicable notably to the FIGS. 1, 3.

The element 118 can also be advantageously used in the circuit shown in FIG. 5; therein only the disturbance 1. is again of importance. In this case inverted outputs which change from "1" to "0" at the end of the phase 37 may disturb other inverted and also non-inverted outputs. The non-inverted outputs which change from "1" to "0" at the end of the phase 36 may disturb other non-inverted outputs (but not the inverted outputs). Thus, the number of possible disturbances is even reduced, but also in this case the addition of the element 118 compensates for the disturbances.

Figure 8:
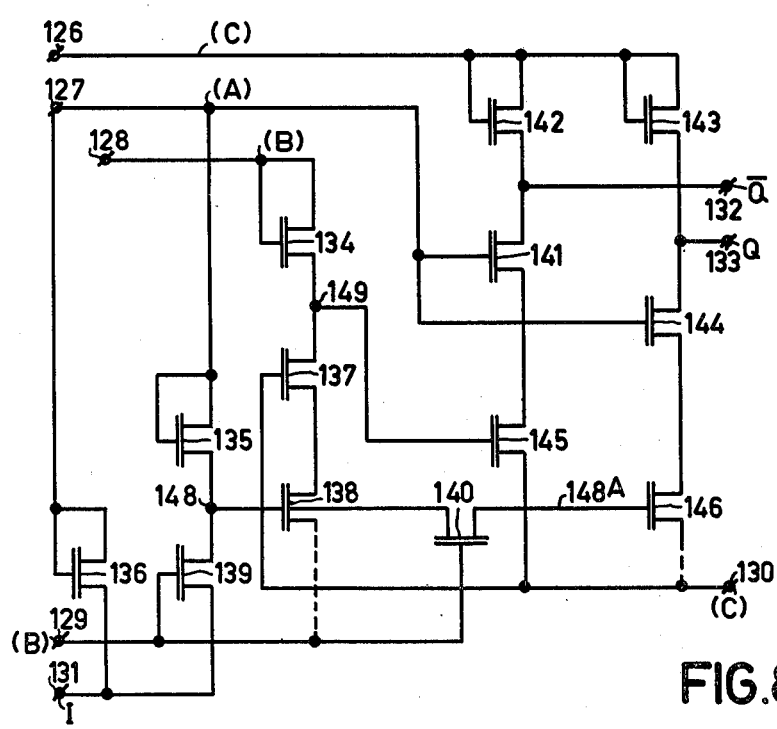
FIG. 8 shows a third sequential logic circuit.
Figure 9:
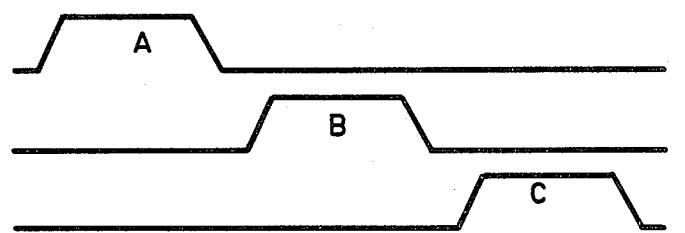
FIG. 9 shows a relevant clock pulse diagram.

FIG. 8 shows a third sequential logic element for the purpose of illustration and FIG. 9 shows a relevant clock pulse diagram. In this case a triple clock pulse having three phases is concerned; these phases are denoted by the letters A, B and C for the sake of simplicity. For example, during the phase A the clock pulse A is also high, the clock pulses B and C are low, and so on cyclicly in a rotating manner. FIG. 8 shows clock pulse input terminals 127 (A), 128, 129 (B), 126, 130 (C), 131 (input data I), 133 (output data Q), 132 (inverted output data $\overline{Q}$). Also shown are transistors 134–146 and nodes 148 and 149. Under the control of the clock pulse A, the node 148 is precharged. Under the control of the clock pulse B, the node 148 is charged to the data I (via the transistor 139) and the node 149 is precharged (via 134). Furthermore, the node 148A is raised to the same potential as the node 148 via the conductive transistor 140

(the node 148A has a comparatively low capacitance). Under the control of the clock pulse C, the nodes of the output terminals 132 and 133 are precharged and the node 149 is sampled via the series connection of the transistors 137 and 138. Under the control of the subsequent clock pulse A, the nodes of the output terminals 132 and 133 are sampled via the series connections of transistor pairs 141/145 and 144/146. The data have become "valid" after sampling. The connections denoted by broken lines may be connected to either the lines, receiving the clock pulses B and C, respectively, or to earth potential. If they are connected to the clock pulse line, the circuit is insusceptible to tolerances in the clock pulses. Connection to ground results in reduced loading of the clock pulse generator. An additional precharging transistor 136 for the input terminal 131 is added to improve the operation.

Figure 10:
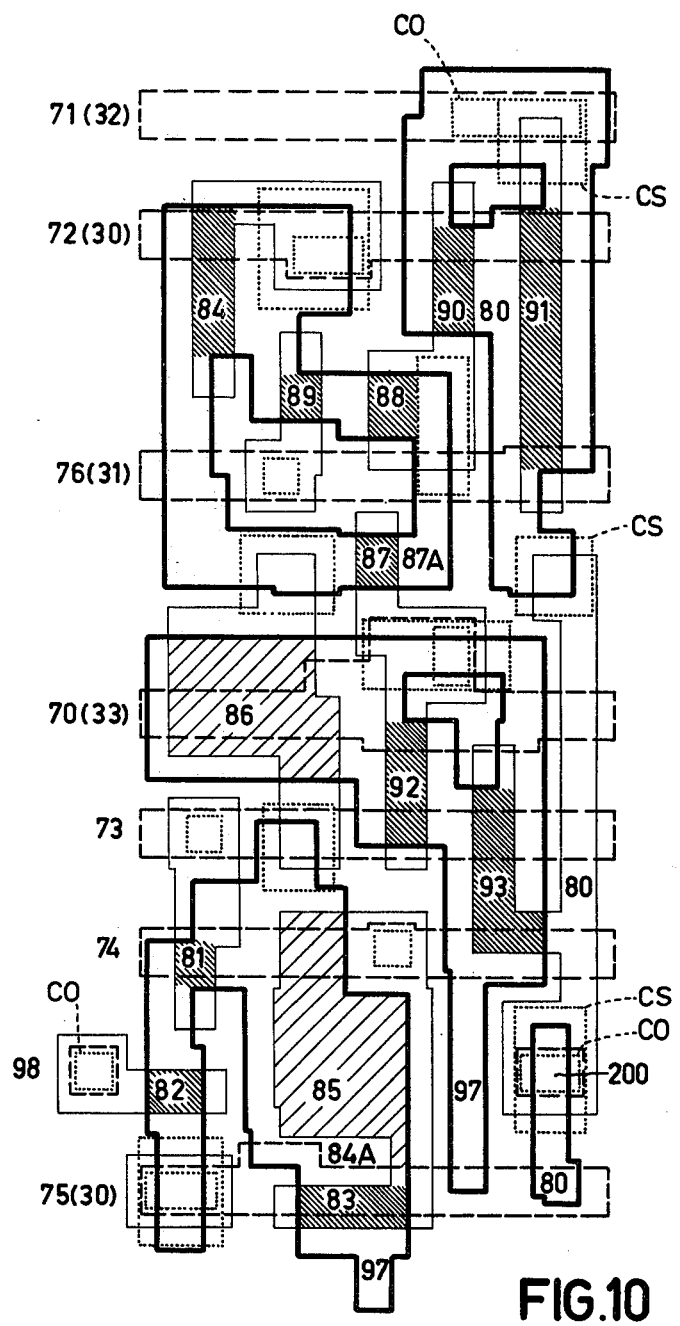
FIG. 10 shows a two-dimensional layout of an element as shown in FIG. 5.

FIG. 10 shows a two-dimensional lay-out of a sequential logic element in accordance with FIG. 5, i.e. by superposition of the required masks. First of all, use is made of the mask OD, enclosed by heavy lines in the Figure, which defines the n+ diffusion zones and hence the oxide zones. This dual function is customary in the n-MOS-technology. The second mask used determines the areas where the silicon (CS) is contacted. In positions where two contact holes are superposed, the CS contact hole generally is the larger one of the two. The mask CS is denoted by dotted lines. The third mask is denoted by thin lines and defines the polysilicon (PS) zones. The CS mask defines the connections between OD and PS. The fourth mask (CO) determines the areas where so-termed holes are contacted, i.e. a conductor (path) without semiconductor properties. This mask is also denoted by dotted lines. Where two contact areas (CO, CS) are provided together, the CO contact hole generally is the smaller one of the two. The fifth mask IN determines the conductive interconnections made of aluminium. This mask is denoted by interrupted lines. The contact holes CO are thus situated in a vertical sense between the polysilicon and/or the n+ diffusion zones on the one side and the aluminium conductor tracks on the other side. Along the substrate face they are always situated within the boundaries of an aluminium conductor.

The transistors appear at areas where an n+ zone is crosses over by a polysilicon zone. The previously stated non-linear capacitances arise at areas where an n+ zone coincides with a polysilicon zone, but no transversely extending current path along the polysilicon zone is formed. The signals fed to the aluminium conductor tracks are shown at the left, i.e. the clock signals according to the curves 30–33 in FIG. 2, while the inputs 73 and 74 are separately shown (FIG. 5). If a number of these sequential logic elements are to be linked, these seven conductor tracks must be interconnected by extension. The Figure also shows some nodes. The node 84A is the junction of the transistors 83 and 84 and extends over a large part of the Figure by way of two interconnections. The node 87A is the junction of the transistors 87 and 90. The input point for signals from the combinatory logic elements is denoted by the reference numeral 97; this point projects downwards from the sequential logic element and can thus be readily connected. The non-inverted output 80 is available on the right lower side as a polysilicon track for connection to said combinatory logic elements. The same is applicable to the inverted output 79. Furthermore, at the right bottom of the circuit a so-called stack contact 200 is provided in which the n+ layer, the polysilicon and the aluminium conductor are interconnected. Therefore, the output data is available also in the aluminium layer at this area. At the left bottom the input 98 is available in aluminium and is interconnected to the n+ diffusion layer. This input projects forwards from the remaining area of the sequential logic circuit and can thus readily coincide with the stack contact 200 of the preceding sequential logic element of the series. The Figure also shows the transistors 81, 82, 83, 84, 87, 88, 89, 90, 91, 92 and 93 and the capacitances 85 and 86 which are realized by an increased surface area of n+ and polysilicon layers. The dimensions of the entire circuit are approximately 100×200 microns; it has a surface area of approximately 0.02 mm$^2$.

What is claimed is:

1. An integrated circuit in dynamic MOS technology, comprising:

clock input means for receiving repetitive clock cycle signals, each cycle having a succession of first, second and third clock phase signals; a plurality of single bit hold circuits (DFF), each having:

a first data input;

an input gate fed by said first data input and having first control means for being rendered transmitting by a first clock phase signal;

an intermediate gate fed by said input gate and having second control means for being rendered transmitting by a second clock phase signal next to said first clock phase signal;

at least a first output gate fed by said intermediate gate and having third control means for being rendered transmitting by a third clock phase signal next to said second clock phase signal and having a first data output;

a set of logic gates having second inputs for receiving a second plurality of binary signals as generated on said first data outputs and therefrom producing by combinatory logic means a third plurality of binary signals on second data outputs coupled to respective first data inputs while being enabled by said first clock phase signal in coincidence with said input gate of said single bit hold circuits;

having a succession of first, second, third and fourth clock phase signals;

at least one of said single bit hold circuits having a second output gate fed by said intermediate gate and having fourth control means for being rendered transmitting by a fourth clock phase signal next to said third clock phase signal and having a third data output connected to a further one of said second input, wherein the signals on the first and third data outputs of a same single bit hold circuit are mutually inverse.

2. An integrated circuit as claimed in claim 1, wherein a third plurality of single bit hold circuits are disposed within and filling a strip area having a first side and a second side, and wherein all first data inputs and all first data outputs pertaiing to said third plurality are situated at said first side.

3. An integrated circuit as claimed in claim 1, wherein each second data output is connected to a respective single bit hold circuit by means of the only first data input thereof.

4. An integrated circuit as claimed in claim 1, wherein said single bit hold circuits are disposed within and filling a strip area to form a row, and wherein within said row the single bit hold circuits are interconnected in that each has a third data input, and each pair of a preceding and a next single bit hold circuit have the third data input of the latter connected to a fourth data output of the former, and wherein all third data inputs comprise fifth control means for being rendered transmitting by a test control signal that is common to all single bit hold circuits of the row while disabling all further data inputs to the single bit hold circuits of the row, for serially receiving a test pattern or the third data input of the first single bit hold circuit of said row.

5. An integrated circuit as claimed in claim 4, wherein the last single bit word circuit of the row has a fifth data output for serially outputting in coincidence with said test control signal a test result pattern.

6. An integrated circuit as claimed in claim 2, characterized in that the data node of the input gate is connected to be precharged by the first clock pulse phase and sampled by the second clock pulse phase, the data outputs of the sequential logic elements being connected to the control electrode of a relevant non-linear MOS capacitor, the other electrode of which is connected to a control terminal in order to be activated during the first and the second phase of the clock pulse cycle and to conduct this activating signal by way of the high value of the capacitance or to block it by way of the low value of the capacitance, respectively.

* * * * *